US009984763B1

(12) United States Patent
Vilas Boas et al.

(10) Patent No.: US 9,984,763 B1
(45) Date of Patent: May 29, 2018

(54) SAMPLE AND HOLD CIRCUIT

(71) Applicant: NXP USA, INC., Austin, TX (US)

(72) Inventors: Andre Luis Vilas Boas, Amparo (BR); Richard Titov Lara Saez, Campinas (BR); Ivan Carlos Ribeiro Do Nascimento, Campinas (BR); Javier Mauricio Olarte Gonzalez, Campinas (BR)

(73) Assignee: NXP USA, INC., Austin, TX (US)

( * ) Notice: Subject to any disclaimer, the term of this patent is extended or adjusted under 35 U.S.C. 154(b) by 0 days. days.

(21) Appl. No.: 15/365,041

(22) Filed: Nov. 30, 2016

(51) Int. Cl.
| | |
|---|---|
| *G11C 27/02* | (2006.01) |
| *H03K 17/06* | (2006.01) |
| *H03K 5/159* | (2006.01) |

(52) U.S. Cl.
CPC .......... *G11C 27/024* (2013.01); *H03K 5/159* (2013.01); *H03K 17/06* (2013.01)

(58) Field of Classification Search
CPC ..... G11C 27/02; G11C 27/024; G11C 27/026; G11C 27/028
See application file for complete search history.

(56) References Cited

U.S. PATENT DOCUMENTS

| | | | | |
|---|---|---|---|---|
| 3,778,725 A | * | 12/1973 | Spaargaren | G05B 1/02 327/331 |
| 4,399,474 A | * | 8/1983 | Coleman, Jr. | G11B 20/1492 360/46 |
| 4,544,854 A | | 10/1985 | Ulmer et al. | |
| 4,973,975 A | * | 11/1990 | Yamazaki | H03M 1/1295 327/91 |
| 5,517,141 A | * | 5/1996 | Abdi | G11C 27/026 327/306 |
| 5,684,425 A | | 11/1997 | Nicollini et al. | |
| 5,703,506 A | * | 12/1997 | Shook | H04B 10/697 322/50 |
| 6,215,335 B1 | * | 4/2001 | Rabii | H03K 5/1532 327/58 |
| 6,275,178 B1 | * | 8/2001 | Koifman | G11C 27/024 257/312 |
| 6,346,851 B1 | | 2/2002 | Zhang et al. | |

(Continued)

FOREIGN PATENT DOCUMENTS

EP      2650881 A1      10/2013

OTHER PUBLICATIONS

U.S. Appl. No. 15/209,573, entitled "Sample-And-Hold Circuit", filed Jul. 13, 2016.

(Continued)

*Primary Examiner* — Thomas J Hiltunen
(74) *Attorney, Agent, or Firm* — David G. Dolezal

(57) ABSTRACT

A sample and hold circuit including a charge path coupled to a voltage source. A first node of the charge path is located closer to the voltage source in the charge path than a second node of the charge path. The second node is coupled to an output of the sample and hold circuit to provide an output voltage. The sample and hold circuit includes a comparator circuit that compares the voltage of the first node and the voltage of the second node. When the comparator circuit determines that the voltage of the first node is a first condition with respect to a voltage of the second node, a voltage source provides a charging voltage on the first path to charge a first capacitor and a second capacitor to the charging voltage.

21 Claims, 3 Drawing Sheets

(56) References Cited

U.S. PATENT DOCUMENTS

| | | | | |
|---|---|---|---|---|
| 6,774,617 B2* | 8/2004 | Andoh | ............... | G01R 19/04 |
| | | | | 324/103 P |
| 7,436,221 B2 | 10/2008 | O'Halloran et al. | | |
| 7,495,479 B1* | 2/2009 | Hsu | ............... | G11C 27/024 |
| | | | | 327/94 |
| 7,812,646 B2 | 10/2010 | Augustyniak et al. | | |
| 7,956,652 B2* | 6/2011 | Tomisato | ............ | G11C 27/024 |
| | | | | 327/82 |
| 8,547,270 B1* | 10/2013 | Strode | ............... | H03M 1/1061 |
| | | | | 341/155 |
| 8,890,577 B1* | 11/2014 | Trampitsch | ......... | H03K 5/2481 |
| | | | | 327/94 |
| 9,158,320 B1 | 10/2015 | Shrivastava | | |
| 2013/0271185 A1 | 10/2013 | Landoulsi et al. | | |
| 2014/0145691 A1 | 5/2014 | Nagda et al. | | |
| 2014/0362957 A1 | 12/2014 | Morishita | | |
| 2016/0056763 A1* | 2/2016 | Zhao | ............... | H03B 5/24 |
| | | | | 331/111 |
| 2016/0104543 A1 | 4/2016 | Powell | | |

OTHER PUBLICATIONS

Mansano, A., "Power Management Controller for Automotive MCU Applications in 90nm CMOS Technology", IEEE 2011.

Non-final office action dated Nov. 20, 2017 in U.S. Appl. No. 15/209,573.

Notice of Allowance dated Mar. 27, 2018 in U.S. Appl. No. 15/209,573.

* cited by examiner

SAMPLE AND HOLD CIRCUIT

BACKGROUND OF THE INVENTION

Field of the Invention

This invention relates in general to an electronic circuit and more specifically to a sample and hold circuit.

Description of the Related Art

A sample and hold circuit generally includes one or more capacitors for sampling a voltage and then providing an indication of the sampled voltage.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a sample and hold circuit includes a first capacitor coupled to a first node of a charge path and a second capacitor coupled to a second node of the charge path. An input of the charge path is coupled to a voltage source. The first node is located closer to the input in the charge path than the second node. The second node is coupled to an output of the sample and hold circuit to provide an output voltage. The sample and hold circuit includes a comparator circuit that compares the voltage of the first node and the voltage of the second node. When the comparator circuit determines that the voltage of the first node is a first condition with respect to a voltage of the second node, a voltage source provides a charging voltage on the charge path to charge the first capacitor and the second capacitor to the charging voltage. After the charging, the voltage source is disabled from providing the charging voltage, but the output of the sample and hold circuit continues to provide the sampled charging voltage.

With some embodiments of the system disclosed herein, the capacitors of the sample and hold circuit are charged only when needed as indicated by the comparator circuit instead of having to be charged at periodic intervals. Thus, the energy consumption of the system is reduced, especially during a low power mode in conditions (e.g. at low temperatures) where frequent recharge is not required.

Figure 1:
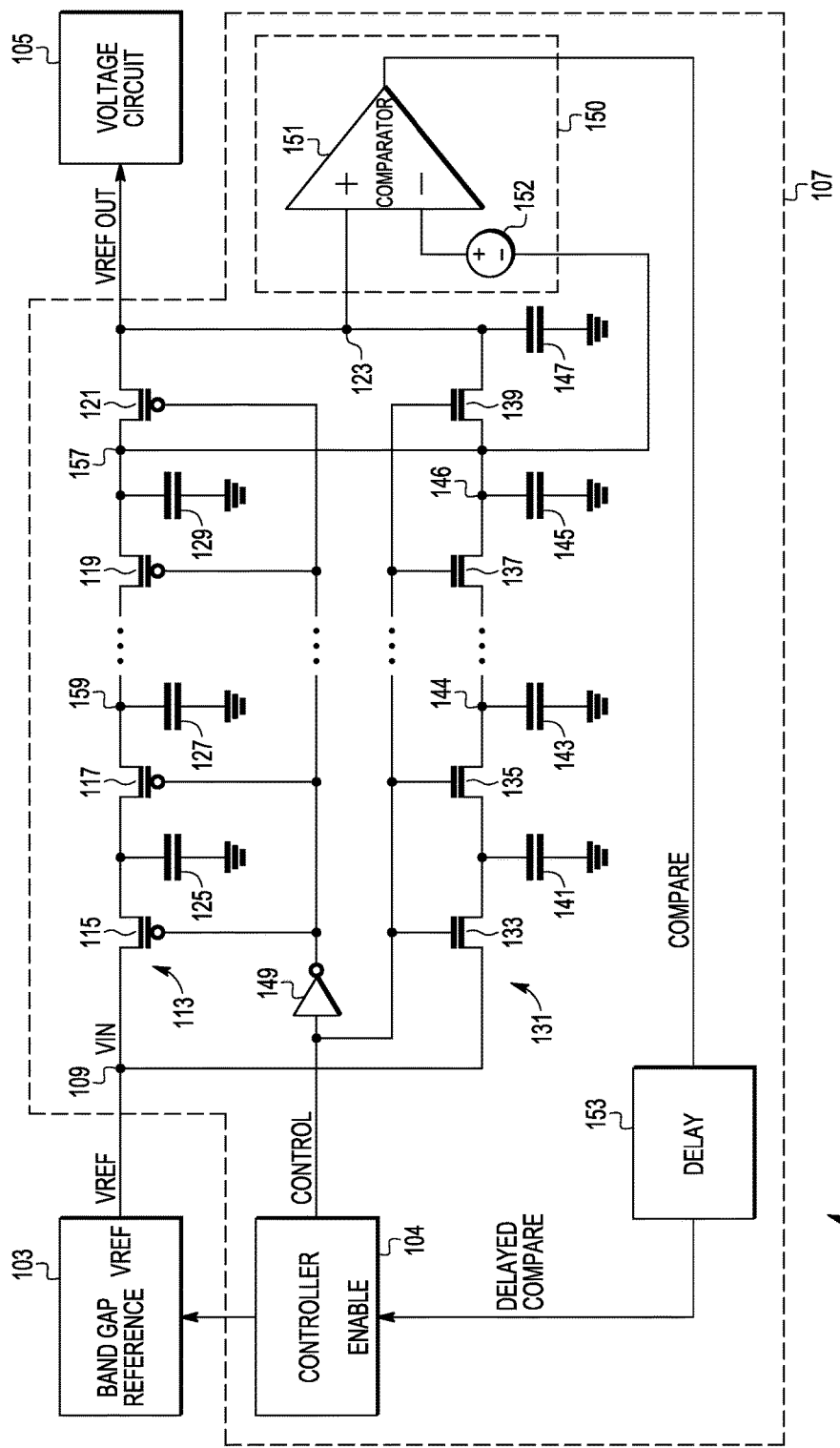
FIG. 1 is a circuit diagram of a power management controller that includes a sample and hold circuit according to one embodiment of the present invention.

FIG. 1 is a circuit diagram of a power management controller according to one embodiment of the present invention. Power management controller includes band gap reference 103, a sample and hold circuit 107, and a voltage circuit 105. In one embodiment, voltage circuit 105 includes a voltage regulator or switching converter that provides a controlled supply voltage to a system (not shown). Voltage circuit 105 receives a reference voltage signal (VRef OUT) that provides a reference voltage used in the operation of voltage circuit 105. In one embodiment where voltage circuit 105 is a low power voltage regulator, voltage circuit 105 uses the VRef OUT voltage as a reference voltage for supplying a supply voltage. However, the VRef OUT signal can be used for other uses by other circuits such as an oscillator, processor, memory circuit, or analog circuit in other embodiments to provide a reference voltage.

Band gap reference 103 provides a reference voltage (VRef) when enabled. In one embodiment, band gap reference 103 provide a voltage VRef of 1.2 V, but may provide other voltages in other embodiments. In one embodiment, the band gap reference is a voltage reference source with a current consumption of 100 µA, but may be of other sizes in other embodiments.

Sample and hold circuit 107 includes a controller 104 that enables and disables band gap reference 103 in providing the VRef voltage in response to a delayed COMPARE signal from delay element 153 and provides a CONTROL signal for controlling the conductivity of the switches (e.g. 115, 133) of the charge paths of circuit 107 during a charging operation.

Sample and hold circuit 107 includes multiple capacitors and switches for providing the VRef Out signal and a comparator circuit 150 that provides an indication (the COMPARE signal) of when the capacitors need recharging based on a comparison of the voltages of different nodes of the sample and hold circuit. In the embodiment shown, in response to an indication of a difference in voltage of the nodes of a charge path, controller 104 initiates a recharge operation.

Sample and hold circuit 107 includes charge path 113 with an input node 109, switch 115, switch 117, switch 119, and switch 121 and nodes 159 and 157. In the embodiment shown, switch 121 includes a current terminal connected to output node 123 which provides the VRef OUT signal. Capacitors 125, 127, and 129 include electrodes connected to nodes between the switches (e.g. node 159 is connected to an electrode of capacitor 127). The other electrodes of the capacitors are connected to ground (or another supply terminal in other embodiments). In the embodiment shown, switches 115, 117, 119, and 121 are implemented as PMOS transistors, but may be implemented as other types of switches in other embodiments (e.g. NMOS transistors, other types of transistors, passgates etc.) In one embodiment, capacitors 125, 127, 129, and 147 are implemented as capacitor configured transistors, but may be implemented as other types of capacitors such as fringe capacitors in other embodiments.

Charge path 131 is coupled to input node 109 and includes switches 133, 135, 137, and 139. Path 131 extends from node 109 to node 123. Capacitors 141, 143, and 145 each include electrodes connected to nodes of current path 131 located between the switches (e.g. node 146 is connected to an electrode of capacitor 145). In the embodiment shown, switches 133, 135, 137, and 139 are implemented as NMOS transistors, but may be implemented as other types of switches in other embodiments.

In the embodiment shown, node 146 in charge path 131 is connected to node 157. In such a configuration, switches 121 and 139 form a passgate switch between node 157 and node 123. In one embodiment, the switches are implemented as fully depleted transistors on an SOI substrate.

In one embodiment, capacitors 125, 127, 129, 141, 143, and 145 are of a smaller size that capacitor 147. In one embodiment, capacitors 125, 127, 129, 141, 143, and 145 are 0.8 µF and capacitor 147 is 8 µF, however these capacitors maybe of other sizes in other embodiments. In one embodiment, capacitor 147 larger than the other capacitors by a ratio in the range of 2 to 30 times. In another embodiment, the ratio of the size of capacitor 147 to the size of the other capacitors is at least 5 to 1. However, the ratio of the size of capacitor 147 to size of the other capacitors may be of other ratios in other embodiments. Making capacitor 147 a larger size than the other capacitors of the sample and hold circuit may provide for a more stable VRef OUT signal.

In the embodiment shown, dashed lines are located between switch 119 and node 159 in charge path 113 and located switch 137 and node 144 in path 131 to indicate that sample and hold circuit 107 may include more switch/capacitor pairs in each of these current paths. However, in other embodiments, sample and hold circuit 107 may include less capacitors than shown (e.g. only including capacitors 145 and 147).

In the embodiment shown, comparator circuit 150 includes a comparator 151 having a non inverting input connected to node 123 and an inverting input connected to an offset voltage circuit 152 of comparator circuit 150. The offset voltage circuit 152 is connected to node 157. When the voltage of node 123 is higher than the voltage of node 157 (by the offset voltage of offset voltage circuit 152 in the embodiment shown) due to capacitors 129 and 145 discharging, comparator circuit 150 asserts a COMPARE signal, which is delayed for a period of time (e.g. 5 microseconds) by delay element 153 before being provided to the enable input of controller 104. This COMPARE signal indicates that a recharge of the capacitors of sample and hold circuit 107 is needed. In one embodiment, the offset voltage is 100 mV, but may be of another value in another embodiment. In one embodiment, comparator circuit 150 is characterized as an unbalanced differential input stage comparator circuit. In one embodiment, the offset circuit can be a battery or resistor. In other embodiments, comparator circuit may having other configurations and/or circuitry for providing an offset voltage.

Figure 2:
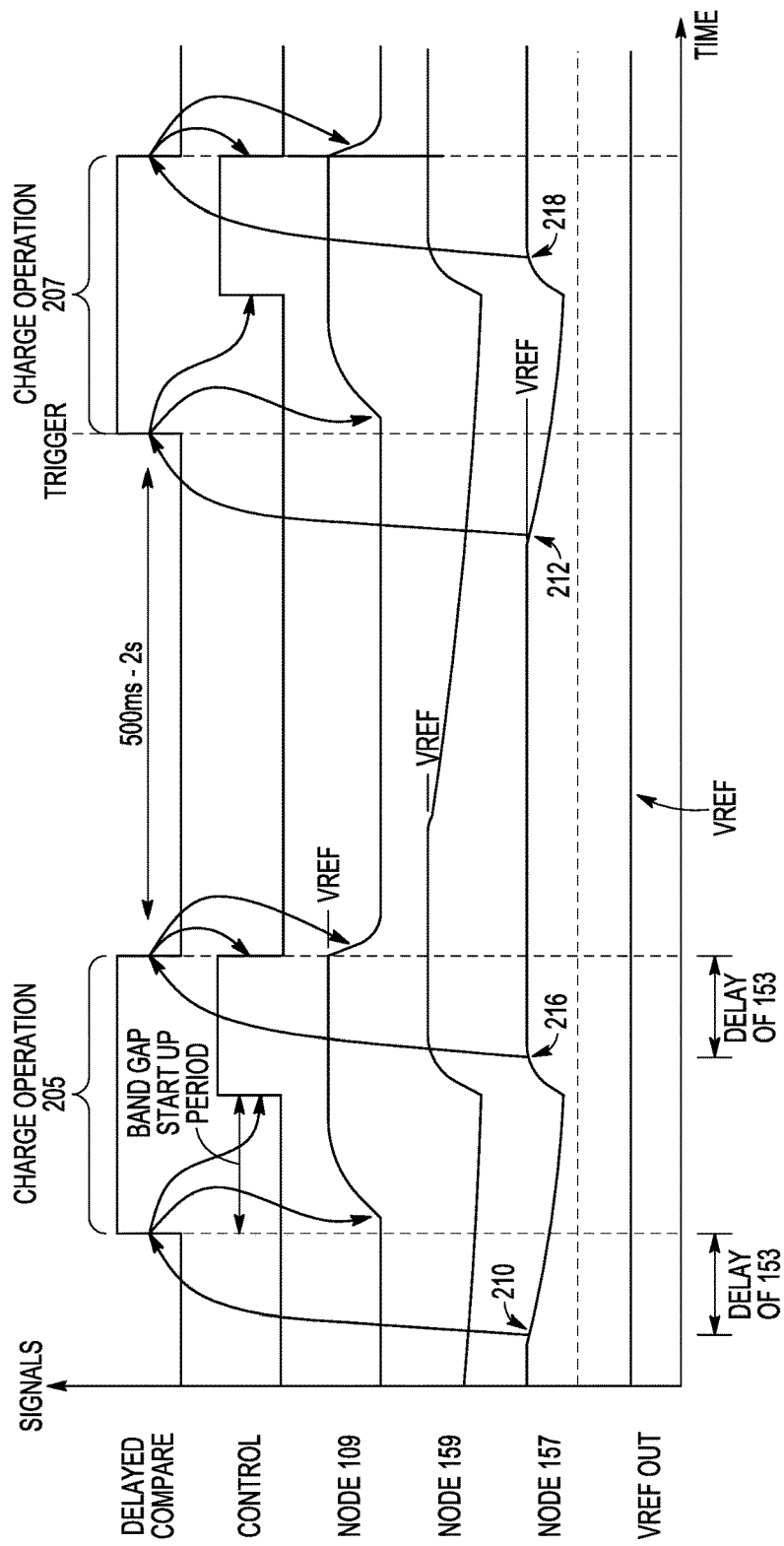
FIG. 2 is a timing diagram showing the operation of the sample and hold circuit of FIG. 1 according to one embodiment of the present invention.

FIG. 2 is a timing diagram showing an operation of sample and hold circuit 107 according to one embodiment of the present invention. FIG. 2 shows the operation of sample and hold circuit 107 during two charge operations 205 and 207 where the capacitors of sample and hold circuit 107 are charged. See the voltages of nodes 159 and 157 rise during charge operations 205 and 207 in FIG. 2. Circuit 107 provides the voltage VRef at VRef Out during the charge operations and between the charge operations. In the embodiment shown, controller 104 only enables band gap reference 103 to provide voltage VRef when the capacitors are charging. See the voltage of node 109 showing that node 109 is at a ground voltage when not in a charge operation (205 and 207).

Because the VRef output of band gap reference 103 (and node 109) is pulled down to ground outside of a charge operation, a voltage differential across switch 115 is created between fully charged capacitor 125 (at voltage VRef) and node 109 (ground). Likewise, the same voltage differential is created across switch 133 between fully charged capacitor 141 and node 109. In embodiments where switch 115 is a PMOS transistor and switch 133 is an NMOS transistor, this voltage differential can generate leakage currents through switches 115 and 133 to discharge capacitors 125 and 141, respectively. As capacitors 125 and 141 discharge, they create voltage differentials across switches 117 and 135, respectively. These voltage differentials cause leakage currents through those switches which discharge capacitors 127 and 143, respectively. See the voltage of node 159 decrease between charging operation 205 and charging operation 207 in FIG. 2. As capacitors 127 and 143 discharge, they create voltage differentials across switches 119 and 137, respectively. These voltage differentials causes capacitors 129 and 145 to discharge. When capacitors 129 and 145 start to discharge, the voltage of node 157 begins to drop. When comparator circuit 150 senses that the voltage of node 157 drops below the voltage of node 123 (which is held higher by the charge stored in capacitor 147) by the offset voltage of offset voltage circuit 152, comparator circuit 150 asserts the COMPARE signal (see at time 210 in charge operation 205 and at time 212 in charge operation 207). After a predetermined delay (e.g. 5 µsec) by delay element 153, the delayed COMPARE signal is provided to the enable input of controller 104 to begin a charge operation. Although not shown in FIG. 2, just prior to a charge operation, the voltage at node 123 (Vref Out) may drop slightly due to the discharge of capacitor 147. In some embodiments, circuit 107 is configured such that the discharge of capacitor 147 is within tolerances (e.g. 10 millivolts or less in some embodiments).

Upon the assertion of the delayed COMPARE signal, controller 104 enables band gap reference 103 to provide the voltage VRef to node 109. See the voltage of node 109 rise from ground to VRef during charge operations 205 and 207 in FIG. 2. After a predetermined period of time (labeled "band gap startup period" in charge operation 205 in FIG. 2), controller 104 asserts the CONTROL signal to make switches 133, 135, 137, and 139 conductive to charge capacitors 141, 143, 145, and 147. The assertion of the CONTROL signal also makes switches 115, 117, 119, and 121 conductive (through inverter 149) to charge capacitors 125, 127, 129, and 147. The capacitors are charged to the VRef voltage provided by band gap reference 103. Once the voltage of node 157 is within the voltage of node 123 by the offset voltage (at time 216 in charge operation 205 and time 218 at charge operation 207), the compare circuit 151 de-asserts the COMPARE signal. After a delay of element 153, the delayed COMPARE signal is de-asserted. In response, controller 104 disables band gap reference 103 and the VRef signal is pulled to ground and the CONTROL signal is de-asserted to turn off switches 115, 117, 119, 121, 133, 135, 137, and 139. The delay in the de-assertion of the COMPARE signal by delay element 153 allows for the capacitors to be fully charged to voltage VRef before the charge operation is stopped. In some embodiments, a charge operation may last 20 µsec, but may last different time amounts in other embodiments. After the switches of sample and hold circuit 107 are open, the band gap reference 103 is disabled and its output pulled down to ground voltage.

After all of the capacitors of sample and hold circuit 107 are charged to voltage VRef, leakage current through the switches starts to successively discharge the capacitors of the sample and hold circuit 107 staring with the capacitors closest to input node 109 (capacitors 125 and 141). See the above text describing the discharge of the capacitors due to leakage current. Once capacitors 129 and 145 start discharging due to leakage current, comparator circuit 150 asserts the COMPARE signal and the charge operation begins again.

In one embodiment, pulling node 109 to ground when band gap reference 103 is disabled ensures that the significant leakage current to ground passes through the switches of the charge paths to node 109 and therefore the capacitors closer to node 109 in a charge path will discharge more quickly than the capacitors located further from node 109. For example, between charge operations, capacitor 125 will discharge more than capacitor 127, capacitor 127 will discharge more than capacitor 129; and capacitor 129 with discharge more than capacitor 147. This configuration ensures that capacitor 147 discharges the least to maintain the voltage Vref Out at a relatively constant level.

With the sample and hold circuit shown in FIG. 1, a charge operation is only performed when needed as determined by comparator circuit 150 while maintaining a relatively constant voltage VRef at node VRef Out. This is in contrast to a timed system where the capacitors of a sample and hold circuit are charged periodically (e.g. every 20 ms). In some embodiments, where the switches (e.g. 115, 133) of sample and hold circuit 107 are MOSFETS, the amount of leakage current is dependent upon the temperature with higher leakage currents occurring at higher temperatures. Accordingly, with the sample and hold circuits described herein, the charging operations can be performed less frequently, especially for a system in a low power mode where operating temperatures are reduced. In some embodiments, the frequency of charge operations can be reduced as much as 30 times as opposed to periodic recharge operations that are scheduled to account for leakage current from the highest operating temperature conditions. For example, with some systems and under some operation conditions, sample and hold circuit 107 can go between 500 msecs-2 secs before recharging. Reducing the number of charge operations reduces power consumption, especially in low power modes.

Furthermore, in the embodiment shown, the charge operations may be performed without the use of a clocking signal or oscillator, which can also reduce power consumption and circuit complexity.

Figure 3:
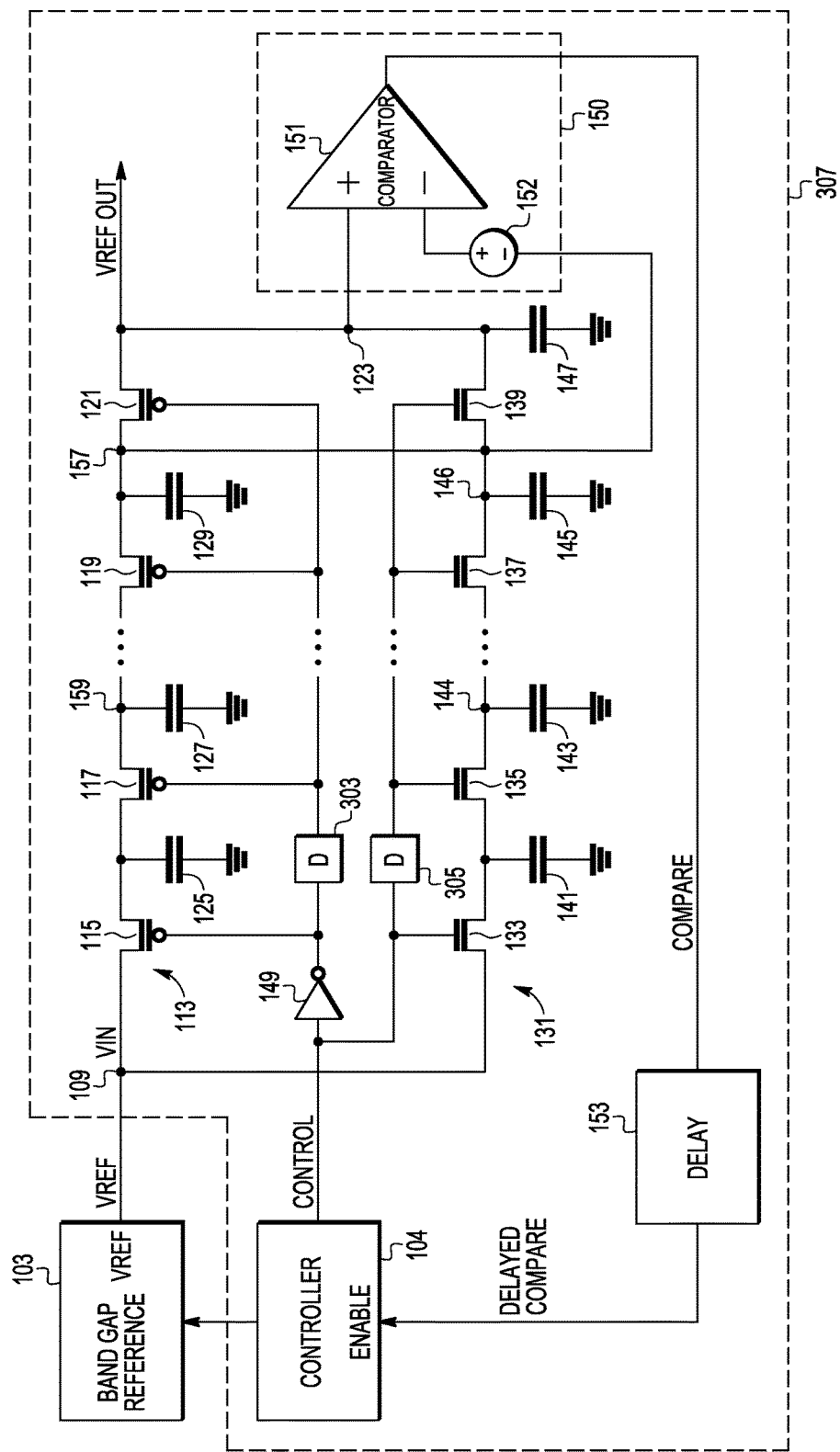
FIG. 3 is a circuit diagram of a circuit including a sample and hold circuit according to another embodiment of the present invention.

FIG. 3 shows another embodiment of a sample and hold circuit 307 according the present invention. Sample and hold circuit 307 is similar to sample and hold circuit 107 where the same reference numbers in both Figures indicate similar devices. The main difference between circuit 307 and circuit 107 is that circuit 307 includes delay elements 303 and 305 for delaying the CONTROL signal from making switches 117, 119, 121, 135, 137, and 139 conductive. The purpose of delay elements 303 and 305 is to charge capacitors 125 and 141 before charging the rest of the capacitors (127, 129, 143, 145, and 147). That way, the other capacitors, (especially capacitor 147) do not discharge to charge capacitors 125 and 141 during the initial portion of a charging operation and thus lower the voltage of node 123. In other embodiments, delay elements (not shown) may be located at other places in providing the CONTROL signal. For example, a delay element may be located between the control terminals of switches 117 and 119 and between the control terminals of switches 135 and 137 such that capacitors 129, 145, and 147 are charged last during a charge operation.

In other embodiments, each sample and hold circuit would only include one charge path. For example, referring to FIG. 1, charge path 113 would not be included in circuit 107. In such an embodiment, sample and hold circuit 107 would not include switches 115, 117, 119, and 121, capacitors 125, 127, and 129, and inverter 149. Likewise, there may be an embodiment that does not include charge path 131. In such an embodiment, sample and hold circuit 107 would not include switches 133, 135, 137, and 139 and capacitors 141, 143, and 145.

In another embodiments, comparator circuit 150 would assert the COMPARE signal in response to another condition such as that the voltage of node 123 is greater than the voltage of node 157. In other embodiments, comparator circuit 150 would include a filter that would filter out momentary glitches in the voltage differentials of nodes 157 and 123. In still other embodiments, comparator circuit 150 would include hysteresis circuitry where the de-assertion of the COMPARE signal would occur at a different voltage condition that the assertion of the COMPARE signal. In other embodiments, a sample and hold circuit would include a second comparator circuit for detecting when the capacitors are fully charged to provide a signal to controller 104 to end a charge operation. In one example, the second comparator circuit would determine when the voltage of node 157 is equal to the voltage of node 109 indicating that capacitor 129 is fully charged. In another embodiment, a sample and hold circuit may include a comparator circuit for determining when to charge each path.

In another embodiment, a sample and hold circuit would not include delay element 153. In such an embodiment, controller 104 would charge the capacitors for a predetermined period of time without relying on comparator circuit 150 to determine when charging is complete. In other embodiments, controller 104 would continue charging for a predetermined period of time after comparator circuit 150 de-asserts the COMPARE signal as a result of a charge operation to ensure that the nodes are charged to voltage VRef.

In other embodiments, the corresponding nodes in each charge path 113 and 131 connected to the capacitors would be connected together. For example, node 159 and node 144 would be connected together. In one example of such an embodiment, only one capacitor would be connected to the node. For example, in an embodiment where nodes 159 and 144 are connected, either one of capacitor 127 or capacitor 143 could be removed. However, in other embodiments, both capacitors 127 and 143 would be connected in parallel. In the embodiments where the corresponding nodes are connected together, the corresponding switches would be a passgate switch. For example in such an embodiment, switch 117 and switch 135 would be a passgate switch in a charge path.

In the embodiment of FIG. 1, one of capacitor 129 or 145 can be removed since they are connected together at node 157 where switches 121 and 139 implement a passgate. In other embodiments, a sample and hold circuit would include only two capacitors e.g. capacitor 145 and capacitor 147. However other circuits may include a greater number of capacitors. One advantage that may occur with multiple capacitors coupled to a charge path at different nodes, is that it delays the discharge of the last capacitor (e.g. 147) until other the other capacitors have discharged to delay the time needed for a recharge operation. Furthermore, another advantage with the sample and hold circuits described herein is that the time for recharging can be determined without the use of another external, active voltage reference (e.g. such as another band gap reference).

In still another embodiments, other types of voltage sources may be used in place of a bad gap reference e.g. such as a resistor divider or a Zener reference.

In other embodiments, comparator circuit 150 can be coupled to other nodes to measure a voltage differential to determine when to recharge the capacitors of a sample and hold circuit. For example, in one embodiment, the input of comparator circuit 150 shown in FIG. 1 as being coupled to node 157 would be coupled to node 159 instead to compare the voltage between node 123 and node 159. In another embodiment, comparator circuit 150 is configured to measure the voltage differential between nodes 159 and 157 to determine when to begin a charge operation. The offset voltage utilized can be selected accordingly to the nodes being compared.

In one embodiment, a sample and hold circuit includes an input receive an input voltage and a charge path coupled to the input. The charge path including a first switch located in the charge path and a first node. The first switch includes a first current terminal coupled to the input and a second current terminal coupled to the first node. The first switch is located between the input and the first node in the charge path. The sample and hold circuit includes a first capacitor including an electrode coupled to the first node to store a charge provided by the input and received from the first node. The sample and hold circuit including a second capacitor including an electrode coupled to a second node of the charge path to store a charge provided by the input and received from the second node. The charge path including a second switch including a first current terminal coupled to the first node and a second current terminal coupled to the second node. The second switch is located between the first node and the second node in the charge path. The sample and hold circuit including a comparator circuit, including a first input coupled to the first node and a second input coupled to the second node. The comparator circuit includes an output for providing a charging signal based upon a voltage difference between the first node and the second node indicative that the first capacitor needs to be recharged from the input by making the first switch conductive.

In another embodiment, a method for operating a sample and hold circuit includes charging a first capacitor of a sample and hold circuit coupled to a first node of a charge path from a voltage source via the charge path including via the first node. The charge path including a second node with a second capacitor of the sample and hold circuit coupled to the second node of the charge path. The second node is located further from the voltage source in the charge path than the first node. The method includes after the charging, comparing a voltage of the first node and a voltage of the second node with a comparator circuit. The method further includes when the voltage of the second node is indicated to be in a first condition with respect to the voltage of the first node as determined by the comparing, charging for a second time, the first capacitor from the voltage source via the charge path including via the first node.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A sample and hold circuit comprising:
   an input to receive an input voltage;
   a charge path coupled to the input, the charge path including a first switch located in the charge path and a first node, the first switch including a first current terminal coupled to the input and a second current terminal coupled to the first node, the first switch is located between the input and the first node in the charge path;
   a first capacitor including an electrode coupled to the first node to store a charge provided by the input and received from the first node;
   a second capacitor including an electrode coupled to a second node of the charge path to store a charge provided by the input and received from the second node, the charge path including a second switch including a first current terminal coupled to the first node and a second current terminal coupled to the second node, the second switch located between the first node and the second node in the charge path;
   a comparator circuit, including a first input coupled to the first node and a second input coupled to the second node, the comparator circuit including an output for providing a charging signal based upon a voltage difference between the first node and the second node indicative that the first capacitor needs to be recharged from the input by making the first switch conductive.

2. The sample and hold circuit of claim 1 further comprising:
   a third capacitor including an electrode coupled to a third node of the charge path to store a charge provided by the input and received from the third node, the charge path including a third switch including a first current terminal coupled to the input and a second current terminal coupled to the third node, the third switch located between the input and the third node in the charge path and the first switch located between the third node and the first node in the charge path;
   wherein the charging signal is indicative that the third capacitor needs to be recharged from the input by making the third switch conductive.

3. The sample and hold circuit of claim 2 further comprising:
   a control input to receive a control signal to make conductive the third switch;
   a delay element coupled between the control input and a control terminal of the first switch, wherein the control signal is delayed by the delay element to make conductive the first switch.

4. The sample and hold circuit of claim 2 further comprising:
   a fourth capacitor including an electrode coupled to a fourth node of the charge path to store a charge provided by the input and received from the fourth node, the charge path including a fourth switch including a first current terminal coupled to the input and a second current terminal coupled to the fourth node, the fourth switch located between the input and the fourth node and the third switch is located between the fourth node and the third node in the charge path;
   wherein the charging signal is indicative that the fourth capacitor needs to be recharged from the input by making the fourth switch conductive.

5. The sample and hold circuit of claim 1 wherein the second capacitor has a greater charge capacity that the first capacitor.

6. The sample and hold circuit of claim 5 wherein the second capacitor has a greater charge capacity than the first capacitor by a ratio in a range of 5-30 times.

7. The sample and hold circuit of claim 1 further comprising:
   an output coupled to the second node to provide a reference voltage including during a time when the input is not providing an input voltage that occurs between two times when the input is providing an input voltage.

8. A circuit comprising the sample and hold circuit of claim 1 and further comprising:
a voltage source including an output coupled to the input to provide an input voltage;
wherein the sample and hold circuit includes a controller including a first output to enable the voltage source to provide an input voltage during a charge operation, the controller including a second output to provide a control signal to make the first switch and the second switch conductive during a charge operation, the controller including an input to receive an indication that the comparator circuit has provided the charging signal.

9. The circuit of claim 8 wherein the voltage source is characterized as a band gap reference.

10. The sample and hold circuit of claim 1 wherein the second switch is characterized as a passgate.

11. The sample and hold circuit of claim 1 wherein the output of the comparator circuit provides the charging signal indicative that the first capacitor needs to be recharged based upon a voltage of the first node being less than a voltage of the second node by an offset voltage.

12. A method for operating a sample and hold circuit comprising:
charging a first capacitor of a sample and hold circuit coupled to a first node of a charge path from a voltage source via the charge path including via the via first node, the charge path including a second node with a second capacitor of the sample and hold circuit coupled to the second node of the charge path, wherein the second node is located further from the voltage source in the charge path than the first node;
after the charging, comparing a voltage of the first node and a voltage of the second node with a comparator circuit;
in response to the voltage of the second node being indicated to be in a first condition with respect to the voltage of the first node as determined by the comparing, charging for a second time, the first capacitor from the voltage source via the charge path including via the first node.

13. The method of claim 12 further comprising:
charging the second capacitor of the sample and hold circuit coupled to the second node of the charge path from the voltage source via the charge path including via the second node;
wherein in response to the voltage of the second node being indicated to be in the first condition with respect to the voltage of the first node as determined by the comparing, charging for a second time, the second capacitor from the voltage source via the charge path including via the second node.

14. The method of claim 12 wherein the first condition is that the voltage of the second node is higher than the voltage of the first node by an offset voltage.

15. The method of claim 12 further comprising:
delaying by a delay element, the charging for a second time for a predetermined time period from when the voltage of the second node is indicated to be in a first condition with respect to the voltage of the first node as determined by the comparing.

16. The method of claim 12 wherein the charge path includes a first switch located between the voltage source and the first node, wherein the charging the first capacitor and the charging for a second time the first capacitor includes making conductive the first switch to charge the first capacitor from the voltage source, wherein the first switch is not conductive when the voltage source is not charging the first capacitor.

17. The method of claim 16 wherein:
the charge path includes a second switch located between the first node and the second node;
in response to the voltage of the second node being indicated to be in the first condition with respect to the voltage of the first node as determined by the comparing, charging the second capacitor from the voltage source via the charge path including via the second switch being conductive.

18. A method for operating a sample and hold circuit comprising:
charging a first capacitor of a sample and hold circuit coupled to a first node of a charge path from a voltage source via the charge path including via the first node, the charge path including a second node with a second capacitor of the sample and hold circuit coupled to the second node of the charge path, wherein the second node is located further from the voltage source in the charge path than the first node;
after the charging, comparing a voltage of the first node and a voltage of the second node with a comparator circuit;
when the voltage of the second node is indicated to be in a first condition with respect to the voltage of the first node as determined by the comparing, charging for a second time, the first capacitor from the voltage source via the charge path including via the first node;
charging a third capacitor of the sample and hold circuit coupled to a third node of the charge path from the voltage source via the charge path including via the third node, wherein the third node is located closer to the voltage source in the charge path than the first node;
wherein when the voltage of the second node is indicated to be in a first condition with respect to the voltage of the first node as determined by the comparing, charging for a second time, the third capacitor from the voltage source via the charge path including via the third node.

19. The method of claim 18 wherein the charging for a second time, the third capacitor is initiated before the charging for a second time, the first capacitor when the voltage of the second node is indicated to be in a first condition with respect to the voltage of the first node as determined by the comparing.

20. A method for operating a sample and hold circuit comprising:
charging a first capacitor of a sample and hold circuit coupled to a first node of a charge path from a voltage source via the charge path including via the first node, the charge path including a second node with a second capacitor of the sample and hold circuit coupled to the second node of the charge path, wherein the second node is located further from the voltage source in the charge path than the first node;
after the charging, comparing a voltage of the first node and a voltage of the second node with a comparator circuit;
when the voltage of the second node is indicated to be in a first condition with respect to the voltage of the first node as determined by the comparing, charging for a second time, the first capacitor from the voltage source via the charge path including via the first node;
wherein the voltage source is disabled between the charging and the charging for the second time.

21. A method for operating a sample and hold circuit comprising:
- charging a first capacitor of a sample and hold circuit coupled to a first node of a charge path from a voltage source via the charge path including via the first node, the charge path including a second node with a second capacitor of the sample and hold circuit coupled to the second node of the charge path, wherein the second node is located further from the voltage source in the charge path than the first node;
- after the charging, comparing a voltage of the first node and a voltage of the second node with a comparator circuit;
- when the voltage of the second node is indicated to be in a first condition with respect to the voltage of the first node as determined by the comparing, charging for a second time, the first capacitor from the voltage source via the charge path including via the first node;
- wherein the voltage source includes an output for providing a charging voltage for the charging and the charging for the second time, wherein the output is grounded between the charging and the charging for the second time.

* * * * *